(12) United States Patent
Chander et al.

(10) Patent No.: US 7,999,665 B2
(45) Date of Patent: Aug. 16, 2011

(54) PLUG-IN VEHICLE HAVING A RECHARGING PORT WITH A STATE OF CHARGE INDICATOR

(75) Inventors: Bala S. Chander, Canton, MI (US); Bruce Carvell Blakemore, Plymouth, MI (US); Jenny Brzozowski, Belleville, MI (US); Dale Gilman, Beverly Hills, MI (US); Duane M. Grider, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 12/791,409

(22) Filed: Jun. 1, 2010

(65) Prior Publication Data

US 2011/0043355 A1 Feb. 24, 2011

Related U.S. Application Data

(60) Provisional application No. 61/234,809, filed on Aug. 18, 2009.

(51) Int. Cl.
*G08B 21/00* (2006.01)
(52) U.S. Cl. ...................... 340/455; 340/636.1; 362/487
(58) Field of Classification Search .................. 340/455, 340/636.1, 540; 362/487, 495, 496; 320/137, 320/155
See application file for complete search history.

(56) References Cited

U.S. PATENT DOCUMENTS

| | | | |
|---|---|---|---|
| 5,596,261 | A | 1/1997 | Suyama |
| 5,614,808 | A | 3/1997 | Konoya et al. |
| 5,751,135 | A | 5/1998 | Fukushima et al. |
| 5,757,595 | A | 5/1998 | Ozawa et al. |
| 6,788,504 | B2 | 9/2004 | Vanderkolk |
| 2007/0088481 | A1 | 4/2007 | McCormick |
| 2009/0021364 | A1 | 1/2009 | Frey et al. |

FOREIGN PATENT DOCUMENTS

| | | |
|---|---|---|
| JP | 8140279 A | 5/1996 |
| JP | 10322918 A | 12/1998 |
| JP | 10322919 A | 12/1998 |
| JP | 10322920 A | 12/1998 |
| JP | 10336908 A | 12/1998 |
| JP | 10336909 A | 12/1998 |
| JP | 10341537 A | 12/1998 |
| JP | 11004546 A | 1/1999 |

*Primary Examiner* — Jeffery Hofsass
(74) *Attorney, Agent, or Firm* — David B. Kelley; Brooks Kushman P.C.

(57) ABSTRACT

A plug-in vehicle includes a vehicle body having an outer panel, a propulsion unit such as an electric motor, a rechargeable battery, a recharging port supported on the outer panel to receive power from an external electric power source, and a display subassembly connected to the battery. The display subassembly has a plurality of lights positioned around the recharging port to illuminate the recharging port and to illuminate in a manner corresponding to a condition of the battery.

13 Claims, 4 Drawing Sheets

PLUG-IN VEHICLE HAVING A RECHARGING PORT WITH A STATE OF CHARGE INDICATOR

CROSS-REFERENCE TO RELATED APPLICATIONS

This application claims the benefit of U.S. provisional patent application Ser. No. 61/234,809, filed on 18 Aug. 2009, which is hereby incorporated herein by reference.

TECHNICAL FIELD

The present invention relates to plug-in vehicles such as plug-in hybrid electric vehicles and plug-in electric vehicles.

BACKGROUND

Plug-in vehicles, such as plug-in hybrid electric vehicles and plug-in electric vehicles, may include a rechargeable power source, such as a battery, that is configured to accept electrical power from a power source located externally to the vehicle. Such external power sources may include standard household electric outlets, external chargers or charging stations.

It is anticipated that owners and operators of plug-in vehicles may recharge their vehicles during the day or overnight in preparation for same-day or next-day's travels. Such vehicles may be charged in garages and carports and/or other poorly illuminated areas. It is therefore anticipated that owners and operators of plug-in vehicles will need an illumination source on their plug-in vehicle to illuminate the recharging port to facilitate engaging the recharging port with an extension cord or other cable.

As plug-in vehicles become more common in the marketplace, it is possible that local utility companies may need to manage the demands placed on their electrical power output by selectively enabling and/or disabling their customers' ability to charge their plug-in vehicles at predetermined times of day.

A person recharging a plug-in vehicle may wish to ascertain information relating to the battery such as whether the battery should or should not be recharged, whether the battery is receiving a charge when plugged in, whether the recharging process has been interrupted by the local utility company, and when recharging of the battery is complete, to name just a few. Additionally, a person recharging the vehicle may wish to input start times or completion times for the recharging process, or other information relating to the operation of the plug-in vehicle.

It may also be desirable to ascertain the state of charge of the battery, whether there is a fault in the recharging process, whether it is advisable to recharge the battery in view of the anticipated length of the next drive, and how often some drivers should recharge the battery. In addition, it may be desirable to have some or all of this information available from outside the vehicle.

SUMMARY

Embodiments of the invention include a plug-in vehicle having a propulsion unit and a vehicle body with an outer panel. The plug-in vehicle includes a rechargeable battery configured to supply power to the propulsion unit. A recharging port is supported on the outer panel, and is configured to receive power from an external power source, such as a household electrical outlet, a portable charger or a charging station. The recharging port is also configured to deliver power to the battery. The vehicle further includes a display subassembly operatively connected to the battery, and which has a plurality of lights disposed around the recharging port that are configured to provide illumination for the recharging port in a manner that corresponds to at least one condition of the battery. The at least one condition of the battery includes a condition other than an indication that the battery is in the process of being charged.

In another embodiment, the plug-in vehicle comprises an electric motor, a rechargeable battery that is configured to supply power to the electric motor, and a recharging port that is supported on the outer panel. The recharging port is configured to receive power from an external power source, such as a household electrical outlet, a portable charger or a charging station, and to deliver power to the battery. The vehicle further includes a display subassembly that is operatively connected to the battery. The display subassembly has a plurality of lights that are disposed around the recharging port. The lights are configured to provide illumination for the recharging port and to illuminate in a manner that corresponds to a condition of the battery.

Embodiments may further comprise a cover member that is supported on the vehicle body and that is configured to move between an open position and a closed position. The cover member conceals the recharging port when in the closed position, and exposes the recharging port when in the open position. The display subassembly is configured to illuminate the lights to provide illumination for the recharging port when the cover member is in the open position or when an intent to charge is detected—e.g., based on proximity of a charge cord, a signal generated by a key fob, a wireless signal, etc. A proximity-based detection can be based on, for example, a motion detector, or a detection of the charge cord, which may include a sensor that is detectable by the display subassembly.

In some embodiments the lights are arranged in a circular configuration around the recharging port. The display subassembly is further configured to illuminate individual lights to form an arc of illuminated lights when the recharging port is connected to the external power source. The magnitude of the angle of the arc, and similarly the length of the arc, corresponds to a state of charge of the battery. For example, the higher the state of charge, the more lights will be lit and the greater will be the length and angle of the arc. The display subassembly may also be configured to emit an audible signal that corresponds to a condition of the battery.

The vehicle may further include a communications subassembly that is connected to the recharging port. The communications subassembly is configured to receive wireless electronic signals, and to interrupt a flow of electrical power through the recharging port in response to a first wireless electronic signal. The communications subassembly may be configured to receive a wireless fidelity (WiFi) signal. In another variation of this implementation, the lights are configured to illuminate in a manner that corresponds to an interruption of the flow of electrical power through the recharging port. The vehicle may also include a switch that is supported on the vehicle body, and which is configured to override the interruption of the flow of electrical power through the recharging port by the communications subassembly. In some embodiments, the communications subassembly is further configured to transmit wireless electronic signals, for example, a second wireless electronic signal transmitted in response to the communications subassembly receiving the first wireless electronic signal.

In some embodiments the vehicle further comprises a clock that is connected to the recharging port. The clock is configured to interrupt a flow of electrical power through the recharging port, for example, at a predetermined times.

The display subassembly may further have a readout window for displaying characters. The display subassembly is configured to receive inputs and to display information that is indicative of a charge state of the battery. The display subassembly may be further configured to receive inputs relating to one of a charging start time or a charging end time for charging the battery. In some embodiments, the display subassembly is supported on the outer panel and is configured to display information indicative of at least one of a status of the external power source, a charge status of the battery, a time remaining until recharging is complete, an interruption in recharging, or a failure of the battery.

The display subassembly may also be configured to receive inputs and to display information indicative of a need to charge the battery. In some embodiments, the display subassembly is further configured to display one of an instruction to charge the battery and an instruction not to charge the battery based on the charge state of the battery when the display subassembly receives an input corresponding to the distance to be driven by the vehicle. The display subassembly may also be configured to display instructions indicating how often the plug-in vehicle requires recharging.

Embodiments of the present invention provide a display subassembly having a plurality of lights positioned around a recharging port, such as a plug, on a plug-in vehicle. The lights of the display subassembly may be arranged in a generally circular pattern. When illuminated, the lights of the display subassembly illuminate the recharging port and, when centered around the recharging port, the lights help to guide the insertion of a charge cord into the recharging plug.

The display subassembly may comprise lights configured to illuminate in multiple colors. For instance, the lights of the display subassembly may illuminate in blue or any other desirable color to illuminate the recharging port and assist a user in the insertion of a plug into a recharging port. Once the plug is inserted into the recharging port and electrical power begins to flow from an external power source, such as a standard household electrical outlet, the lights may illuminate in another color, for instance green, to indicate that the battery of the plug-in vehicle is receiving an electric charge.

The lights may be further configured to emit a third color, for example, red, when a fault is detected such as a short circuit or when a battery has exceeded its service life. Further, the lights may be configured to illuminate in a fourth color, for example, yellow, to indicate deliberate interruption of the charging process by, for example, the local utility company for reasons relating to the user's contractual agreement with the utility company. For example, in exchange for reduced rates, a user may agree to allow the utility company to interrupt the flow of electrical power into the user's plug-in vehicle during peak or other designated hours. In some instances, the user's contract with the local utility company may give the local utility company the right to interrupt delivery of electrical power to the user to help the utility company manage demands for electricity during demand peaks.

To facilitate the utility company's ability to interrupt/manage the recharging of plug-in vehicles, the plug-in vehicle may be equipped with a communications subassembly. The user's home electric meter may be configured to include a transmitter controllable by the utility company and configured to transmit an electromagnetic signal such as a radio frequency signal or a WiFi signal. The communications subassembly on the vehicle may be configured to receive such transmissions, and may be further configured to interrupt the flow of electrical power to the battery when such signals are received. In addition to utility companies, other energy management systems may also be configured to communicate with the vehicle to interrupt and/or manage recharging. The communications subassembly may also be configured to transmit signals including radio frequency signals and WiFi signals for the purpose of alerting the vehicle operator that recharging has been interrupted by the utility company.

In some embodiments, the display subassembly may include a readout window where characters such as digits and letters may be displayed through, for example, light emitting diodes or backlit liquid crystal displays, to provide information to a person recharging the plug-in vehicle. The display subassembly may be configured to display using numbers and/or words the amount of time remaining until battery recharge is complete, whether or not recharging is occurring, whether the battery, the recharging system and/or the external electrical source is experiencing a fault, whether the recharging process has been interrupted by a utility company, whether or not recharging is advisable and how often recharging should occur.

BRIEF DESCRIPTION OF THE DRAWINGS

The description herein makes reference to the accompanying drawings wherein like reference numerals refer to like parts throughout the several views, and in which.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily drawn to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

A greater understanding of the embodiments of the invention described herein may be obtained through a review of the figures accompanying this disclosure together with a review of the detailed description that follows.

Figure 1:
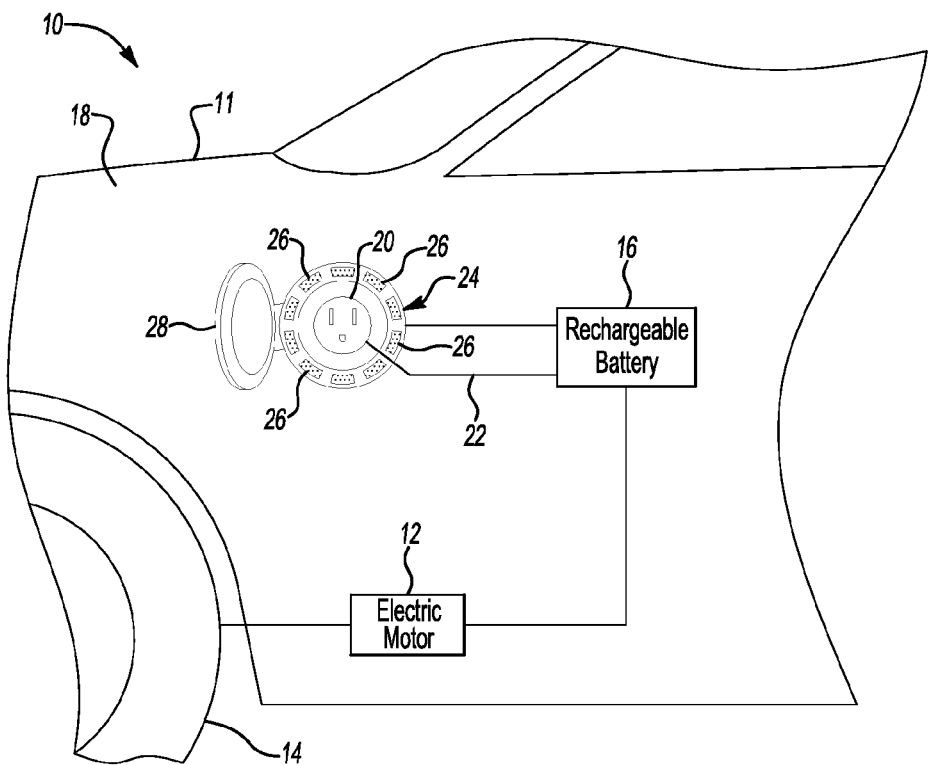
FIG. 1 is a schematic view illustrating an embodiment of a plug-in vehicle made in accordance with the teachings of the present invention.

With respect to FIG. 1, a schematic side view of a the vehicle 10 is illustrated. The vehicle 10 may be any type of automobile including, but not limited to, sedans, coupes, SUVs, CUVs, pickup trucks, minivans, full size vans, commercial vehicles, convertibles, recreation vehicles, all terrain vehicles, golf carts, neighborhood electric vehicles, battery electrical vehicles and fuel cell vehicles and buses. The vehicle 10 includes a vehicle body 11 and a propulsion unit, which in this embodiment is an electric motor 12 configured to deliver torque to front wheels 14. In other embodiments, torque may be delivered to rear wheels or to all wheels on the vehicle, and other types of propulsion units may be used. Electric motor 12 receives electrical power from battery 16 which is configured to store electrical energy supplied by a source external to the vehicle 10. In some embodiments of the vehicle 10, an internal combustion engine (not shown) is connected to vehicle body 11 and configured to deliver torque to wheels such as front wheels 14 to assist electric motor 12 in propelling the vehicle 10. In other embodiments, the internal combustion engine may also be configured to recharge battery 16. In still other embodiments, the internal combustion engine's sole duty may be to recharge battery 16.

Vehicle body 11 includes an outer panel 18. In the embodiment illustrated in FIGS. 1, 4 and 5, outer panel 18 comprises a front quarter panel of vehicle body 11. A recharging port 20 is supported on outer panel 18. In the illustrated embodiment, recharging port 20 is configured to engage a standard three-hole plug of an electrical extension cord and is further configured to receive a charge from a standard household electrical outlet rated at approximately 120 volts or from an external charger or a charging station.

In other embodiments, a unique plug dedicated to the recharging of plug-in vehicles may be employed. In still other embodiments, the recharging port may be configured to receive an electric charge from electrical outlets providing power at approximately 240 volts, or at other voltages. Thus, the connector configuration can consist of straight pins, it can be a twist-lock type, an SAE or other configuration. Recharging port 20 is connected to battery 16 via a recharging cable 22 that is configured to deliver electrical power from recharging port 20 to battery 16. Recharging port 20 may also be configured to detect the presence of a plug or other device engaged with recharging port 20.

Display subassembly 24 is supported on outer panel 18, and is positioned to encircle recharging port 20. It is connected to battery 16 and further configured to detect the state of charge of battery 16. In other embodiments, display subassembly 24 may also be attached to an external charger or charging station to provide the same vehicle information in circumstances where there is a wired or wireless communication connection to the vehicle. Display subassembly 24 includes a plurality of lights 26 arranged in a generally circular pattern and positioned to illuminate recharging port 20 when lights 26 are illuminated. In the illustrated embodiment, the lights 26 of display subassembly are centered around recharging port 20 to present a "bulls-eye" to assist a user attempting to engage recharging port 20 with an extension cord or other recharging cord. Lights 26 may be configured to illuminate in a plurality of colors. For instance, when cover member 28 is first opened at the beginning of a recharging cycle, lights 26 may illuminate in blue.

Figure 4:
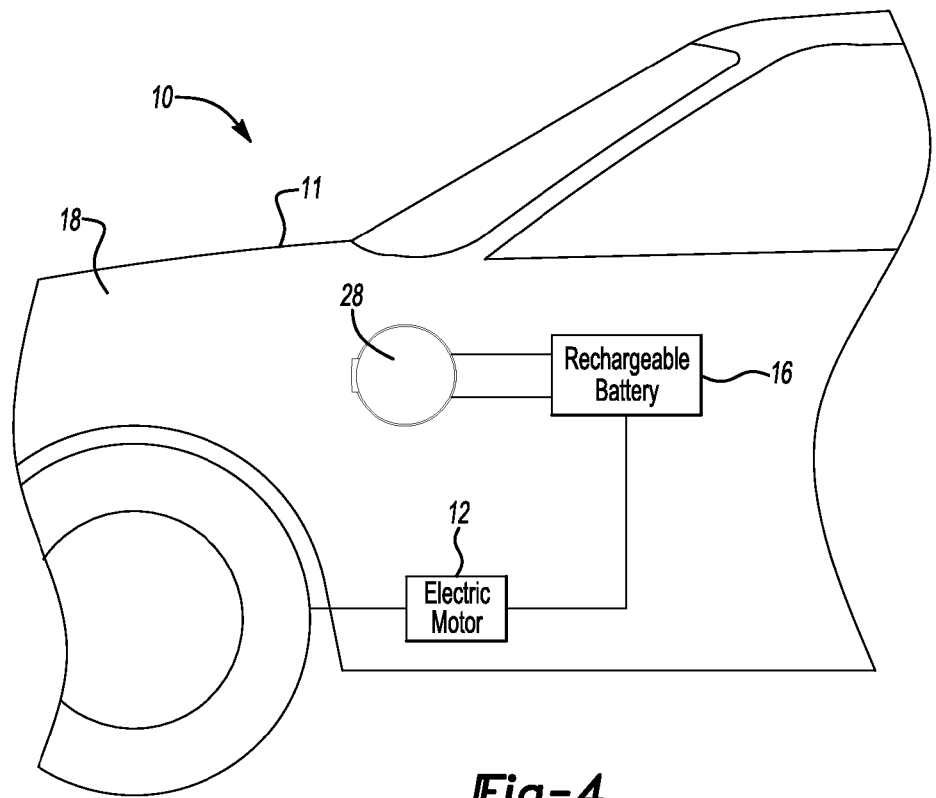
FIG. 4 illustrates the plug-in vehicle of FIG. 1 with a cover concealing the display subassembly and the recharging port.

The cover member 28 is hingedly connected to outer panel 18 and configured to move between an open position as illustrated in FIG. 1 wherein recharging port 20 and display subassembly 24 are visible, and a closed position as illustrated in FIG. 4 wherein recharging port 20 and display subassembly 24 are concealed. Display subassembly 24 may be configured to illuminate when cover member 28 is moved from the closed position to the open position to provide illumination of recharging port 20 in a darkened environment. In some embodiments, cover member 28 may cover both recharging port 20 and display subassembly 24 when closed. In other embodiments, cover member 28 may only cover recharging port 20 when closed such that illumination from display subassembly 24 is visible when cover member 28 is closed. In still other embodiments, cover member 28 may be excluded altogether.

Figure 2:
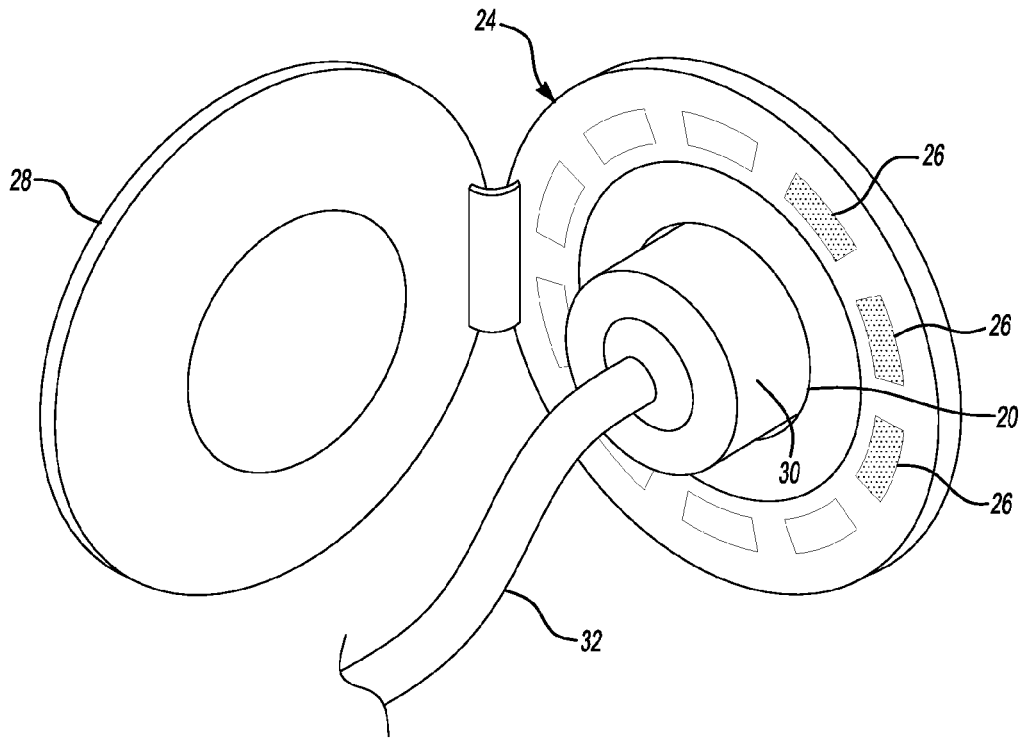
FIG. 2 is a perspective view of a recharging port and a display subassembly, at an early stage of the recharging process, for the plug-in vehicle of FIG. 1.

With respect to FIG. 2, an expanded view is presented of the recharging port 20, the display subassembly and the cover member 28 of FIG. 1. As depicted in FIG. 2, a plug 30 of a charge cord assembly, such as an extension cord assembly 32, is engaged with recharging port 20. An opposite end (not shown) of extension cord assembly 32 is attached to a household electrical outlet and electrical power is flowing into recharging port 20. Display subassembly 24 is configured to provide information to a user about battery 16. For example, when recharging port 20 is receiving electrical power through extension cord assembly 32 and battery 16 is receiving a charge, display subassembly 24 may be configured to illuminate in a second color, for instance, green, to indicate that battery 16 is receiving a charge.

Figure 3:
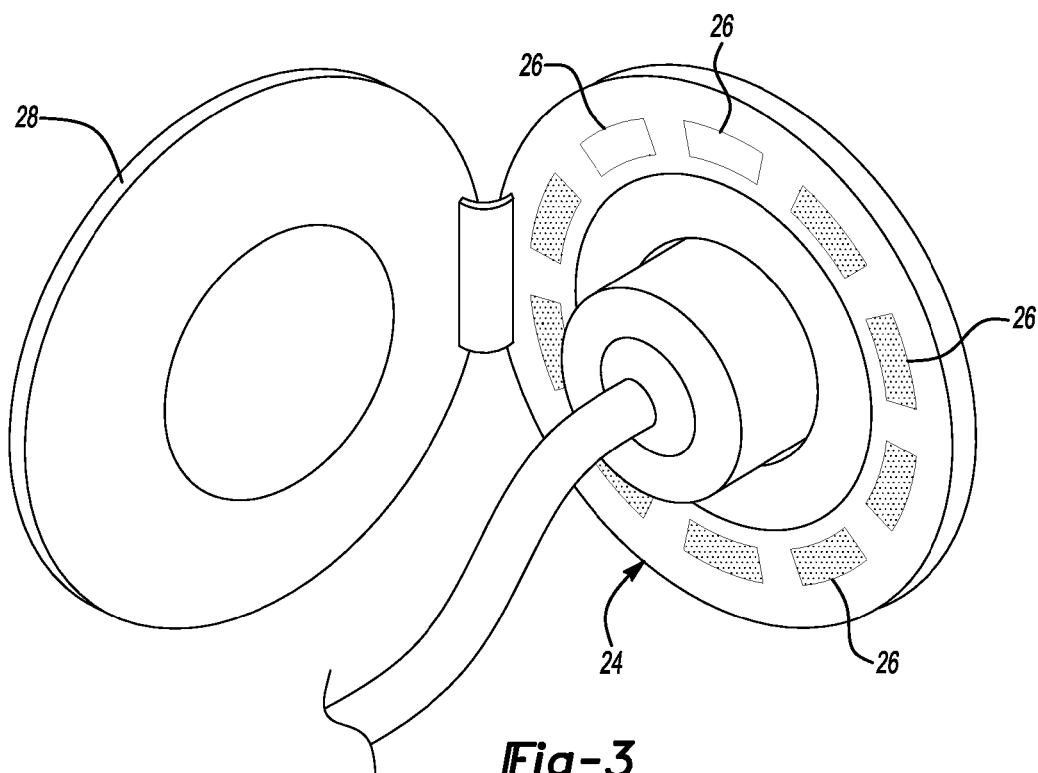
FIG. 3 illustrates the recharging port and the display subassembly of FIG. 2 at a later stage during the recharging process.

Additionally, display subassembly 24 can communicate to a user the current state of charge of battery 16. In the illustrated embodiment, display subassembly 24 is configured to illuminate a portion of the lights 26 in an arc, the length of which correlates to the percentage of charge of battery 16. The greater the number of lights that are illuminated, the closer to completion the recharging process is. With respect to FIG. 3, all but two of the lights 26 are illuminated indicating that the recharging process is nearly complete. When the last two lights 26 are illuminated, the charging of battery 16 is complete.

Display subassembly 24 may be further configured to communicate the occurrence of a fault during the recharging process. For example, display subassembly 24 may be configured to illuminate each of the lights 26 in red to indicate that although plug 30 is engaged with recharging port 20, electrical power is not flowing to battery 16. In other embodiments, rather than illuminating the lights 26 in red when a fault is detected, display subassembly 24 may be configured to blink the lights 26 on and off in blue to alert the user of a fault. In still other embodiments, when a fault is detected, the lights 26 may flash on and off in red. In other embodiments, other colors and flash patterns may be employed.

With respect to FIG. 4, the vehicle 10 is illustrated with extension cord assembly 32 removed and cover member 28 closed. With cover member 28 in the closed position, cover member 28 conceals both display subassembly 24 and recharging port 20. This may be desirable to provide protection to recharging port 20 and display subassembly 24 from the elements such as wind, rain and sun. In some embodiments, a rubber seal or gasket may be provided to provide a generally water resistant fit between cover member and outer panel 18. Cover member 28 will also shield from other vehicles the illumination of lights 26 in embodiments where display subassembly 24 does not turn lights 26 off when cover member 28 is in the closed position.

Figure 5:
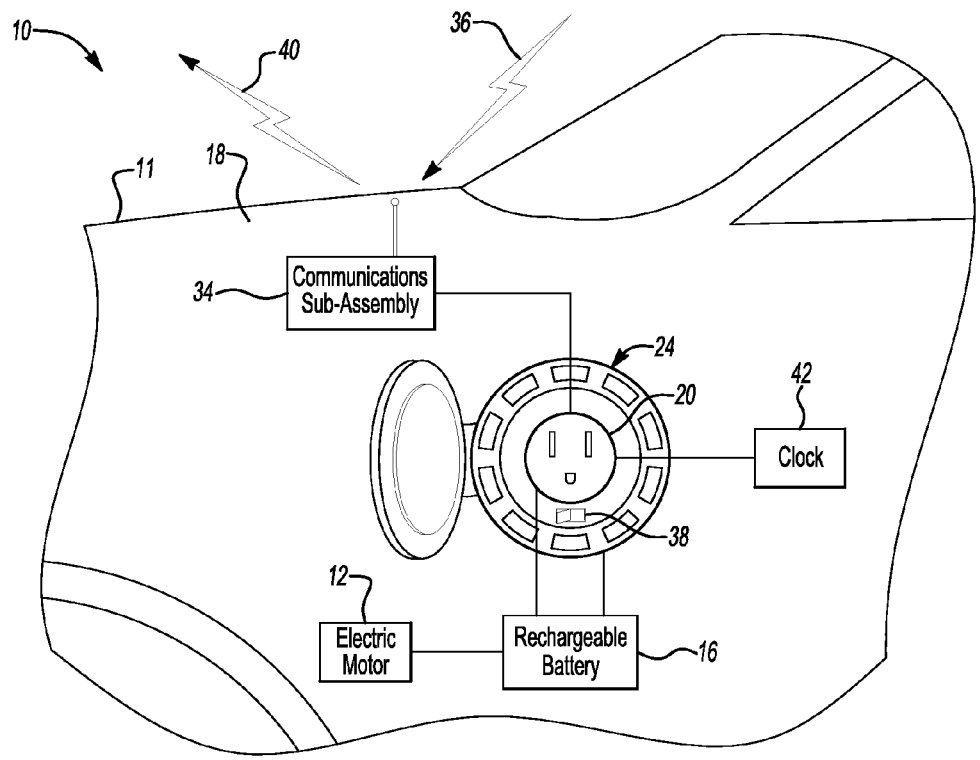
FIG. 5 illustrates a side view of alternate embodiments of the plug-in vehicle of FIG. 1.

With respect to FIG. 5, an alternate embodiment of the vehicle 10 is illustrated. In the embodiment depicted in FIG. 5, a communications subassembly 34 is connected to vehicle body 11. Communications subassembly 34 is further connected to recharging port 20 and is configured to disrupt or interrupt the flow of electrical power through recharging port 20 to battery 16. Communications subassembly 34 is further configured to receive a first wireless signal 36. First wireless signal 36 may include, but is not limited to, radio frequency signals and WiFi signals.

Communications subassembly 34 facilitates communications with a local utility company by receiving transmissions from an antenna or other communications device disposed on or co-located with an electric meter associated with the vehicle 10. For instance, the vehicle 10 may be parked in the garage of a private dwelling of the owner of the vehicle 10. An electric meter, used by the local utility company to determine how much electricity is consumed by the homeowner, may include a transmitter configured to transmit first wireless signal 36 to communications subassembly 34. In this manner, the local utility company can control the recharging of the vehicle 10 by sending an interrupt signal to the vehicle 10. The interrupt signal will be received by communications subassembly 34 and communications subassembly 34 may then interrupt the flow of electrical power through recharging port 20.

In addition to utility companies, other energy management systems may also be configured to communicate with the vehicle to interrupt/manage charging. For example, a signal from an external source, such as a utility company, may indicate that a lower rate is available for electricity at a later, predetermined time. In such a case, the charge cord 32 may be plugged into the recharging port 20, but the display subassembly 24 will indicate, in a manner different from a state of charge indication, that the flow of electrical power to the battery 16 is delayed until the predetermined time. In some embodiments, other options may be available to take advantage of what is known as the "smart grid", which provides for communication of information from an electrical grid to a user of the energy. For example, a vehicle owner may select an option that, where available, only energy generated from "alternative" energy sources—e.g., wind, solar, etc.—will be used to charge the vehicle.

Display subassembly 24 may be further configured to indicate that the electric charging of battery 16 has been interrupted by the local utility company through the illumination of a fourth color, for example, yellow or through flashing a predetermined pattern of any desirable color.

An override switch 38 is supported on outer panel 18 proximate recharging port 20. Override switch 38 is configured to disable the ability of communications subassembly 34 to interrupt the flow of electrical power through recharging port 20. Override switch 38 gives the person recharging the vehicle 10 the option to proceed with electric charging despite higher costs associated with recharging at predefined times or despite the request by the local utility company to interrupt the recharging process.

In some embodiments, communications subassembly 34 may be further configured to transmit a second wireless signal 40. Communications subassembly 34 may transmit second wireless signal 40 in response to receiving first wireless signal 36. Second wireless signal 40 may be directed to a communications device in the possession of the owner or other user of the vehicle 10 or may otherwise be configured to communicate with such person. For example, second wireless signal 40 may comprise a WiFi signal and may include an email message sent to the owner/user of the vehicle 10 to advise him that electric charging of the vehicle 10 has been interrupted by the local utility company.

A second wireless signal 40 may be broadcast to the electric meter and may convey information such as the vehicle's identification number. In this manner, security can be provided to the owner of the vehicle 10 to ensure that only authorized vehicles are receiving a charge from one or more designated plugs in the owner's household. In some embodiments, the transmission of the vehicle identification number may be for the purpose of identifying the vehicle to the utility company and associating that vehicle with the correct billing address. In this way, a vehicle may receive a charge at a dwelling owned by someone other than the vehicle's owner, yet the vehicle owner will be invoiced for the power consumed.

In some embodiments, communications subassembly 34 may be configured such that second wireless signal 40 is compatible with handheld Bluetooth components, cell phones, key fobs, or other types of signals effective for communicating with an owner/user of the vehicle 10. Communications subassembly 34 may also or alternatively be configured to receive a third wireless signal transmitted by the owner/user of the vehicle 10 instructing communications subassembly 34 to override the interruption command transmitted by the local utility company.

In some embodiments of the vehicle 10, a clock 42 may be connected to vehicle body 11 and also connected to recharging port 20. Clock 42 may be configured to interrupt the flow of electrical power through recharging port 20 and may be further configured to permit a user of the vehicle 10 to program in start times, completion times or both for recharging battery 16. This configuration may permit a vehicle owner to take advantage of low cost electricity by defining the times of day when the vehicle 10 accepts a charge.

In addition to illuminating, display subassembly 24 may be configured to emit an audible signal such as, but not limited to, a siren or a chime. Display subassembly 24 may be further configured to provide information to a user about the state of charge of the vehicle using such audible signals. For instance, when a user plugs an external electric power source into recharging port 20 and battery 16 begins to receive a charge, display subassembly 24 may be configured to emit a chime or other audible signal to alert the user that recharging is underway. In circumstances where a fault is detected and battery 16 is not receiving a charge after engaging recharging port 20 with an external power source, display subassembly 24 may be configured to emit a second audible signal such as a siren or a buzz or some other signal to alert the user of the fault. The audible signals may be emitted by display subassembly 24 in addition to, or instead of, the illumination described above.

Figure 6:
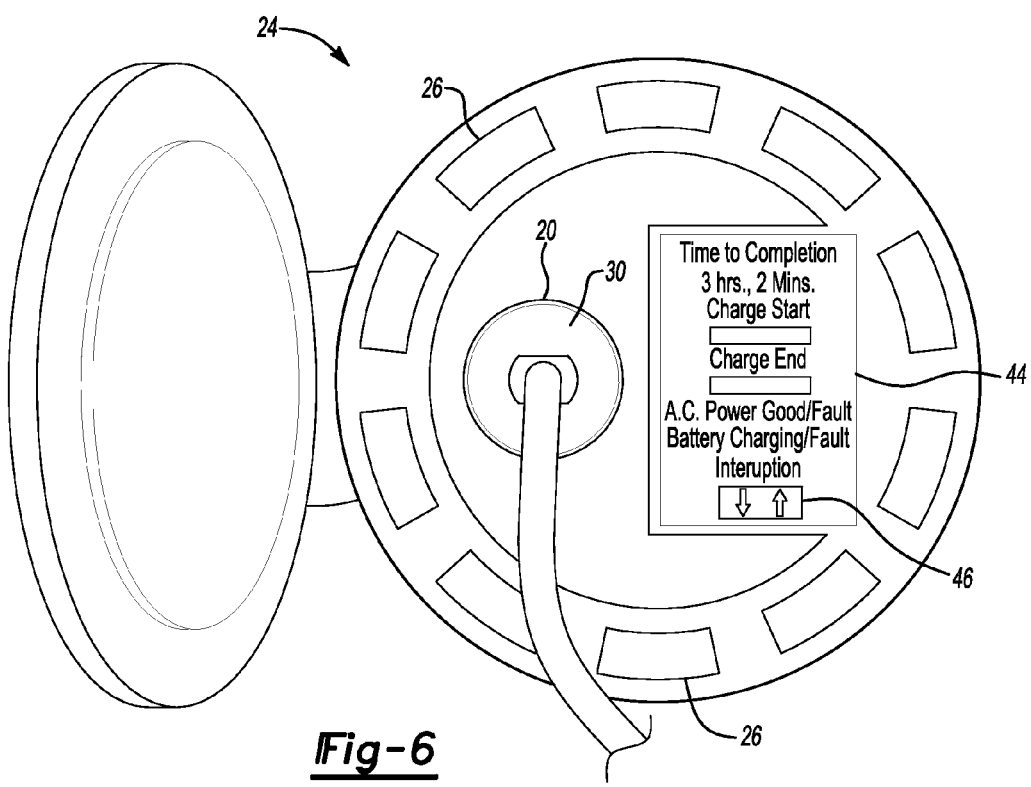
FIG. 6 illustrates an alternate embodiment of a display subassembly for use with the plug-in vehicle of FIG. 1.

With respect to FIG. 6, an alternate embodiment of display subassembly 24 is illustrated. As with the earlier depicted embodiments of display subassembly 24, the display subassembly 24 depicted in FIG. 6 may be disposed along any outer surface of the vehicle 10. In FIG. 6, display subassembly 24 includes a readout window 44 where symbols and characters such as letters and digits may be displayed. Readout window 44 may comprise any mechanism effective to display symbols and characters including, but not limited to, light emitting diodes, illuminated liquid crystal displays, backlit liquid crystal displays, plasma screens, organic LED, electroluminescent, and cathode ray tubes.

The display subassembly 24 of FIG. 6 may provide a variety of information to a person recharging the vehicle 10. For instance, readout window 44 may include a digital-type clock or an analog-type clock depicting the time when charge completion may be set to begin or end. Alternatively, readout window 44 may display the time remaining in hours and minutes until the current recharging cycle is complete. Readout window 44 may also display whether there is a fault in the power outlet to which recharging port 20 is connected, whether battery 16 is receiving a charge or whether there is a fault in battery 16 and whether the recharging process has been interrupted by the local utility company. Readout window 44 may further include an input section 46 to permit a user to set a start time and/or a completion time for the recharging process.

Figure 7:
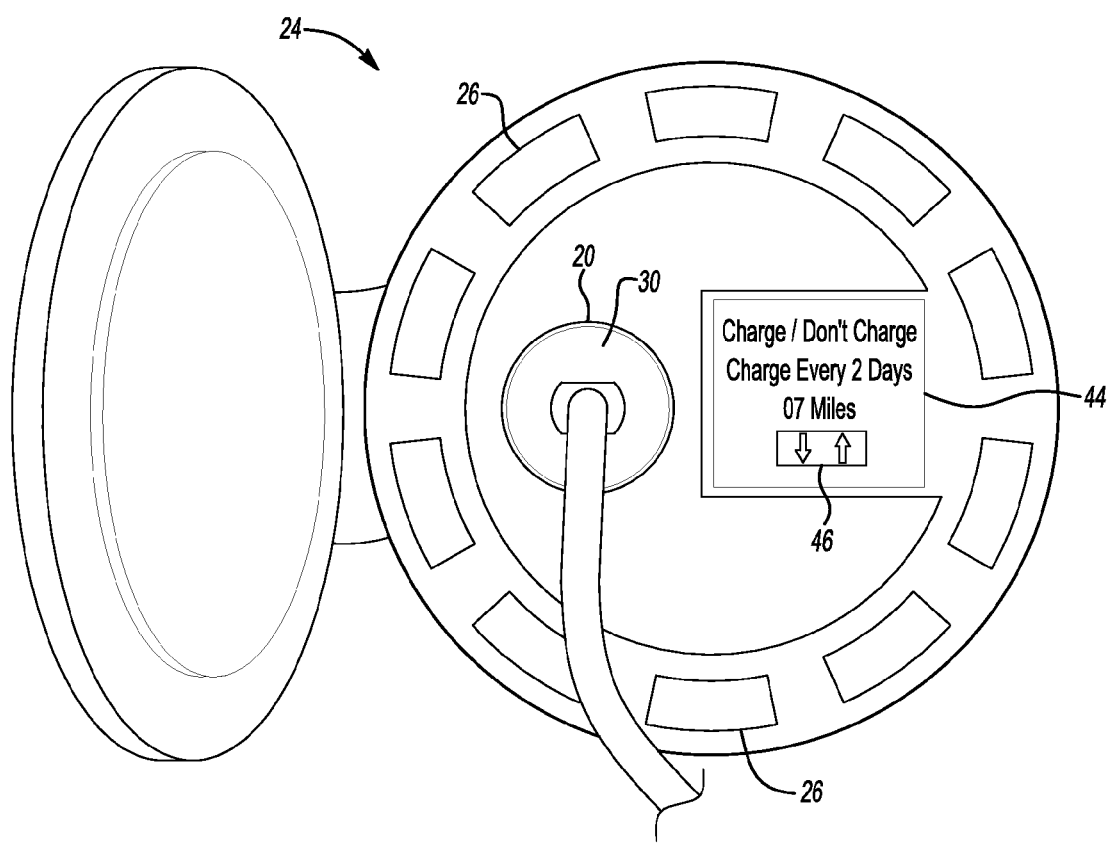
FIG. 7 illustrates a third embodiment of a display subassembly for use with the plug-in vehicle of FIG. 1.

With respect to FIG. 7, another embodiment of display subassembly 24 is illustrated. In the embodiment illustrated in FIG. 7, display subassembly 24 is configured to display instructions to recharge or not to recharge battery 16. Display subassembly 24 is further configured to permit a user to input the anticipated number of miles that the vehicle 10 will travel during the next vehicle operation. A microprocessor, a computer or other device associated with the vehicle 10 or with display subassembly 24 may consider the state of charge of battery 16 and the anticipated distance which the vehicle 10 will be driven during its next operating period and may calculate whether recharging battery 16 is advisable.

The overall life of a rechargeable battery is dependent upon the number of full discharges and recharges the battery undergoes. The microprocessor, computer or other computing device (not shown) may be programmed with an algorithm that calculates whether battery 16 should be recharged in a manner that optimizes the life of battery 16. In other embodiments, the vehicle 10 may record a particular driver's driving habits and duration of vehicle operation to calculate how often battery 16 should be recharged to maximize the life of battery 16 in view of that particular driver's driving habits and patterns. As illustrated in FIG. 7, display window 44 includes an input section 46 which permits a user to input the anticipated number of miles the vehicle will travel during the next vehicle operation.

With respect to the embodiments illustrated in both FIGS. 6 and 7, display subassembly 24 may be configured to illuminate lights 26 solely for the purpose of illuminating recharging port 20. Alternatively, display subassembly 24 may be configured to illuminate lights 26 in the manner discussed above to convey information about the status of battery 16 and other systems and circumstances relating thereto.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed:

1. A plug-in vehicle including a propulsion unit and a vehicle body having an outer panel, the vehicle comprising:
   a rechargeable battery configured to supply power to the propulsion unit;
   a recharging port supported on the outer panel, the recharging port being configured to receive electrical power from an external power source and to deliver power to the battery; and
   a display subassembly operatively connected to the battery and including a plurality of lights disposed in a generally circular configuration around the recharging port, the display subassembly being configured to illuminate some of the lights to form an arc of illuminated lights having an arc length corresponding to the state of charge of the battery when the recharging port is connected to the external power source.

2. The vehicle of claim 1, wherein the display subassembly is further configured to illuminate at least some of the lights when a charge cord is within a predetermined distance of the recharging port.

3. The vehicle of claim 1, further comprising a cover member supported on the vehicle body and configured to move between an open position exposing the recharging port and a closed position concealing the recharging port, the display subassembly being configured to illuminate the lights to provide illumination for the recharging port when one of the cover member is in the open position or an intent to charge is detected.

4. The vehicle of claim 1, wherein the display subassembly is further configured to:
   illuminate the lights in a first manner different from the state of charge indication when the battery is receiving electrical power while the recharging port is connected to the external power source, and
   illuminate the lights in a second manner different from the first manner and from the state of charge indication when the at least one condition includes a fault detected while the recharging port is connected to the external power source.

5. The vehicle of claim 1, further comprising a communications subassembly connected to the recharging port, the communications subassembly being configured to receive wireless electronic signals and to interrupt a flow of electrical power through the recharging port in response to receiving a wireless electronic signal.

6. The vehicle of claim 5, wherein the communications subassembly is configured to receive wireless electronic signals sent by a utility company to interrupt the flow of electrical power through the recharging port.

7. The vehicle of claim 5, wherein the lights are further configured to illuminate in a manner corresponding to an interruption of the flow of electrical power through the recharging port effected by the communications subassembly.

8. The vehicle of claim 5, further comprising a switch supported on the vehicle body and configured to override the interruption of the flow of electrical power through the recharging port by the communications subassembly.

9. The vehicle of claim 5, wherein the communications subassembly is further configured to transmit wireless electronic signals.

10. The vehicle of claim 5, wherein the communications subassembly is configured to transmit and receive wireless electronic signals to and from an electric meter.

11. The vehicle of claim 10 having a vehicle identification number (VIN), and wherein the communications subassembly is configured to transmit a wireless electronic signal to an electric meter indicative of the VIN.

12. The vehicle of claim 1, further comprising a clock connected to the recharging port, the clock being configured to interrupt a flow of electrical power through the recharging port at a predetermined time.

13. The vehicle of claim 1, wherein the display subassembly is further configured to illuminate the lights in a manner different from the state of charge indication when the recharging port is connected to the external power source and electrical power flow to the battery is delayed until a predetermined time.

* * * * *